United States Patent
Bao et al.

(10) Patent No.: US 8,921,167 B2
(45) Date of Patent: Dec. 30, 2014

(54) MODIFIED VIA BOTTOM FOR BEOL VIA EFUSE

(71) Applicant: International Business Machines Corporation, Armonk, NY (US)

(72) Inventors: Junjing Bao, Cedar Grove, NJ (US); Griselda Bonilla, Fishkill, NY (US); Samuel S. Choi, Beacon, NY (US); Ronald G. Filippi, Wappingers Falls, NY (US); Naftali E. Lustig, Croton-on-Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/732,466

(22) Filed: Jan. 2, 2013

(65) Prior Publication Data

US 2014/0183688 A1 Jul. 3, 2014

(51) Int. Cl.
*H01L 23/525* (2006.01)
*H01L 23/522* (2006.01)
*H01L 21/768* (2006.01)

(52) U.S. Cl.
CPC ........ *H01L 23/5256* (2013.01); *H01L 23/5226* (2013.01); *H01L 21/76879* (2013.01)
USPC ........... 438/132; 438/215; 438/281; 438/333; 438/467

(58) Field of Classification Search
CPC ............ H01L 23/5256; H01L 23/5258; H01L 2924/3011; H01L 23/5252; G11C 17/16
USPC .......... 257/209–211, 528–531; 438/131–132, 438/215, 281, 333, 467, 601
See application file for complete search history.

(56) References Cited

U.S. PATENT DOCUMENTS

| | | | |
|---|---|---|---|
| 5,792,680 A * | 8/1998 | Sung et al. | 438/210 |
| 6,242,789 B1 | 6/2001 | Weber et al. | |
| 6,252,292 B1 | 6/2001 | Brintzinger et al. | |
| 6,270,949 B1 | 8/2001 | Faure et al. | |
| 7,298,639 B2 | 11/2007 | Hsu et al. | |
| 7,557,424 B2 | 7/2009 | Wong et al. | |
| 7,741,721 B2 | 6/2010 | Black et al. | |
| 7,816,945 B2 | 10/2010 | Feng et al. | |
| 8,039,379 B1 * | 10/2011 | Alers et al. | 438/584 |
| 8,101,505 B2 * | 1/2012 | Abou-Khalil et al. | 438/467 |
| 8,441,039 B2 * | 5/2013 | Chakravarti et al. | 257/209 |

(Continued)

OTHER PUBLICATIONS

Lin and Kuo, "Electromigration Study of Copper Lines on Steps prepared by a Plasma-based Etch Process", American Institue of Physics, AIP Journal of Applied Physics, 2012.

*Primary Examiner* — Steven Loke
*Assistant Examiner* — Didarul Mazumder
(74) *Attorney, Agent, or Firm* — L. Jeffrey Kelly; Catherine Ivers

(57) ABSTRACT

A method of forming an electronic fuse including providing an $M_x$ level including a first $M_x$ metal, a second $M_x$ metal, and an $M_x$ cap dielectric above of the first and second $M_x$ metal, forming an $M_{x+1}$ level above the $M_x$ level, the $M_{x+1}$ level including an $M_{x+1}$ metal and a via electrically connecting the second $M_x$ metal to the $M_{x+1}$ metal in a vertical orientation, and forming a nano-pillar from the $M_x$ cap dielectric at a bottom of the via and above the second $M_x$ metal, the nano-pillar having a height less than a height of the via.

7 Claims, 8 Drawing Sheets

(56) References Cited

U.S. PATENT DOCUMENTS

| | | |
|---|---|---|
| 2003/0077843 A1* | 4/2003 | Yamauchi et al. ............... 438/3 |
| 2005/0189655 A1* | 9/2005 | Furukawa et al. ............ 257/762 |
| 2005/0266271 A1* | 12/2005 | Tsuchiya et al. .............. 428/810 |
| 2008/0038923 A1 | 2/2008 | Edelstein et al. |
| 2008/0160739 A1* | 7/2008 | Yu et al. ....................... 438/585 |
| 2009/0032959 A1* | 2/2009 | Black et al. ................... 257/773 |
| 2009/0302416 A1* | 12/2009 | Abou-Khalil et al. ........ 257/529 |
| 2009/0309184 A1 | 12/2009 | Kim et al. |
| 2011/0024880 A1* | 2/2011 | Li et al. ........................ 257/618 |
| 2011/0127637 A1* | 6/2011 | Chakravarti et al. .......... 257/529 |
| 2011/0146779 A1* | 6/2011 | Chang et al. .................. 136/256 |

* cited by examiner

MODIFIED VIA BOTTOM FOR BEOL VIA EFUSE

BACKGROUND

1. Field of the Invention

The present invention relates generally to semiconductors, and more particularly, to electronic fuse interconnect structures.

2. Background of Invention

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses may provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration (EM) effects to blow and create the open circuit. For example, EM can be defined as the transport of material caused by the gradual movement of ions in a conductor due to the momentum transfer between conducting electrons and diffusing metal atoms. In e-fuses that take advantage of EM effect, such transport of material caused by the gradual movement of ions can produce voids which cause the e-fuse to blow and create the open circuit.

However, in a typical vertical e-fuse EM may cause undesirable voids, thus creating the open circuit in undesirable locations. More specifically, vertical e-fuses may comprise a via connecting an $M_x$ metal to an $M_{x+1}$ metal, where the $M_{x+1}$ metal is generally positioned above the $M_x$ metal. During programming, voids tend to form in the $M_x$ metal due to EM, and eventually cause the vertical e-fuse to blow and create an open circuit at the $M_x$ metal. An open circuit may be the desired result; however, causing the open circuit to occur at the $M_x$ metal may have undesirable results. An open circuit created by a void in the $M_x$ metal may affect circuits other than the circuit targeted during programming of the e-fuse. These undesired open circuits may therefore decrease chip yield.

Also, the location of the void formation may affect the amount of current required to blow the e-fuse. Generally, higher currents may be required to form a larger void, therefore higher currents may be necessary to cause a void to form in the $M_x$ metal as opposed to the via because the $M_x$ metal may have a larger cross-sectional area than the via.

Accordingly, there exists a need in the art to overcome the deficiencies and limitations described herein above.

SUMMARY

According to one embodiment of the present invention, an electronic fuse structure is provided. The electronic fuse structure may include an $M_x$ level including a first $M_x$ metal, a second $M_x$ metal, and an $M_x$ cap dielectric above of the first and second $M_x$ metal, an $M_{x+1}$ level above the $M_x$ level, the $M_{x+1}$ level including an $M_{x+1}$ metal and a via electrically connecting the $M_x$ metal to the $M_{x+1}$ metal in a vertical orientation, and a nano-pillar located within the via and above the second $M_x$ metal.

According another exemplary embodiment, a method of forming an electronic fuse is provided. The method may include providing an $M_x$ level including a first $M_x$ metal, a second $M_x$ metal, and an $M_x$ cap dielectric above of the first and second $M_x$ metal, forming an $M_{x+1}$ level above the $M_x$ level, the $M_{x+1}$ level including an $M_{x+1}$ metal and a via electrically connecting the $M_x$ metal to the $M_{x+1}$ metal in a vertical orientation, and forming a nano-pillar from the $M_x$ cap dielectric at the bottom of the via and above the second $M_x$ metal.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 2 depicts an $M_x$ level having a first $M_x$ metal and a second $M_x$ metal according to an exemplary embodiment.

FIG. 3 depicts the formation of an $M_x$ cap dielectric according to an exemplary embodiment.

FIG. 4 depicts the formation of a plurality of nano-particles above the $M_x$ cap dielectric according to an exemplary embodiment.

FIG. 5 depicts masking a fuse region and removing some of the nano-particles according to an exemplary embodiment.

FIG. 6 depicts the formation of an $M_{x+1}$ level and an $M_{x+1}$ cap dielectric according to an exemplary embodiment.

FIG. 7 depicts the formation of a via opening in the fuse region according to an exemplary embodiment.

FIG. 8 depicts the formation of a trench opening above the via opening according to an exemplary embodiment.

FIG. 9 depicts the final vertical e-fuse structure in which an $M_{x+1}$ metal is electrically connected to the second $M_x$ metal with a via according to an exemplary embodiment.

FIG. 10 depicts the final vertical e-fuse structure after programming according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to improving the programming reliability and repeatability of an e-fuse structure, and more particularly, to improving the programming reliability and repeatability of an e-fuse structure containing nano-pillars. More specifically, nano-pillars may be incorporated into the e-fuse structure at an interface between a metallization metal and a via to provide different interfacial properties, for example, non-uniform geometry.

Advantageously, the formation of the e-fuse structure of the present embodiment can be implemented in the back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present embodiment thus allows e-fuses to be fabricated during normal interconnect process flows, thus advantageously reducing processing costs for manufacturing e-fuses which are normally fabricated in different process flows.

In particular, multilayer electronic components may include multiple layers of a dielectric material having metallization on each layer in the form of vias, pads, straps connecting pads to vias, and wiring. Vias or other openings in the dielectric layer may extend from one layer to another layer. These openings may be filled with a conductive material and may electrically connect the metallization of one layer to the metallization of another layer and provide for the high-density electronic component devices now used in industry. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, nitride.

Figure 1:
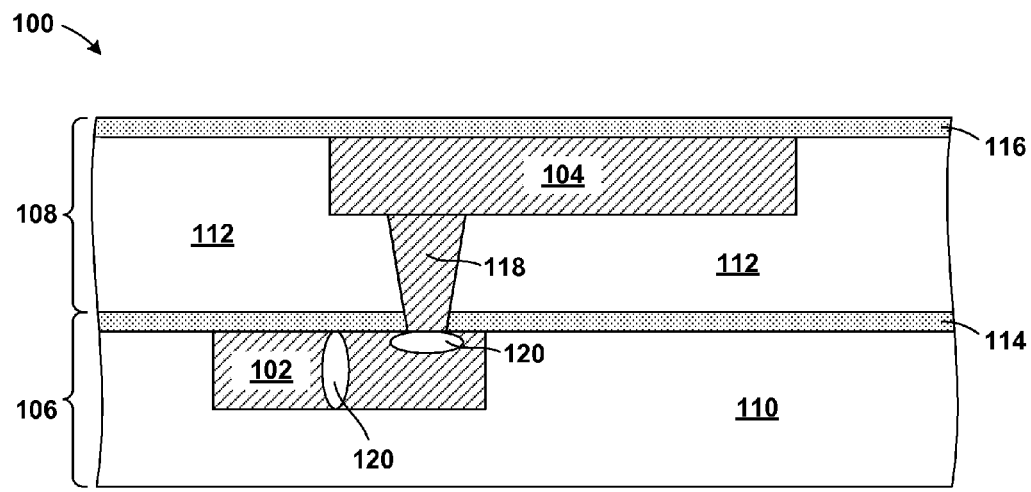
FIG. 1 depicts a cross-sectional view of a vertical e-fuse after programming according to the prior art.

By way of example FIG. 1 illustrates a structure 100 having a typical e-fuse structure in which the EM failure mode of the e-fuse structure after programming is depicted. The e-fuse may include an $M_x$ level 106, an $M_{x+1}$ level 108, and a via 118. The $M_x$ level 106 may include an $M_x$ dielectric 110 and an $M_x$ metal 102. The $M_{x+1}$ level 108 may include an $M_{x+1}$ dielectric 112 and an $M_{x+1}$ metal 104. An $M_x$ cap dielectric 114 may be located between the $M_x$ dielectric 110 and the $M_{x+1}$ dielectric 112 and electrically insulate the $M_x$ metal 102 from the $M_{x+1}$ metal 104. An $M_{x+1}$ cap dielectric 116 may be located above the $M_{x+1}$ dielectric 112 and electrically insulate the $M_{x+1}$ metal 104 layer from additional interconnect levels (not shown) that may be subsequently formed above.

The via 118 electrically connects the $M_x$ metal 102 to the $M_{x+1}$ metal 104. The $M_x$ metal 102, the $M_{x+1}$ metal 104, and the via 118 make up the typical e-fuse. The e-fuse is a structure that may be blown in accordance with the application of a suitable electrical current. For example, an electrical current may be provided through the e-fuse to eventually cause the e-fuse to blow and create an open circuit. Programming refers to blowing an e-fuse and creating the open circuit. A suitable electrical current may range from about 10 mA to about 15 mA, and ranges there between. Additionally, a circuit may be considered to be programmed, and open, when the e-fuse resistance is equal to or exceeds about 10K ohms. During programming of a e-fuse, voids 120 unexpectedly form due to non-optimized processing. Formation of the voids 120 may be uncontrollable and affects the yield and reliability of the e-fuse. The voids 120 are due in part to the EM of material from the $M_x$ metal 102 to the via 118. The voids 120 located in the $M_x$ metal 102 cause the e-fuse to blow at the $M_x$ metal 102. Therefore, an open circuit may be formed at the $M_x$ metal 102 during programming. An open circuit may be the desired result of programming the e-fuse, however, an open circuit in the $M_x$ metal 102 may affect other circuits (not shown) that may be connected to the a $M_x$ metal 102.

Ideally, programming will cause only the targeted e-fuse to blow while maintaining the integrity of all surrounding circuits. One method by which to increase the programming reliability and repeatability of the targeted e-fuse may be to force void formation and therefore force an open circuit to occur within the via only. This method may ensure that only the targeted e-fuse is affected by programming and is described in detail below by referring to the accompanying drawings FIGS. 2-10. More specifically, nano-pillars may be incorporated into the e-fuse structure at an interface between a metallization metal and a via to provide different interfacial properties, for example, non-uniform geometry. During programming an open circuit may be formed at the interface between the metallization metal and the via due to the non-uniform geometry. It should be noted that while only two $M_x$ metals are depicted in the following set of drawings a single chip may include more than two $M_x$ metals.

Figure 2:
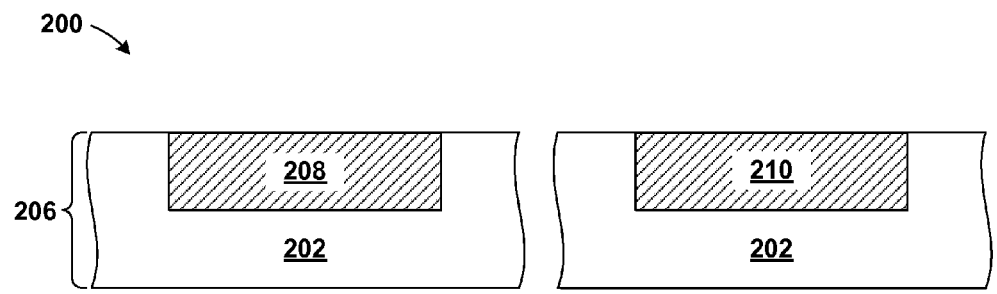
FIGS. 2-10 illustrate the steps of a method of forming a vertical e-fuse according to an exemplary embodiment.

Referring now to FIG. 2, a structure 200 is shown. The structure 200 may include an $M_x$ level 206. The $M_x$ level 206 may include an $M_x$ dielectric 202, a first $M_x$ metal 208, a second $M_x$ metal 210, and an $M_x$ cap dielectric 212 (not shown, see FIG. 3). The $M_x$ dielectric 202 may be, for example, silicon dioxide ($SiO_2$), silicon nitride ($Si_3N_4$), organosilicate glass (SiCOH), aromatic thermoset (SiLK), or porous dielectrics. The $M_x$ level 206 may be any interconnect level in the structure 200. It should be noted that while only a single interconnect level is shown, the structure 200 may have multiple interconnect levels above and below the $M_x$ level 206. The $M_x$ cap dielectric 212 may be subsequently deposited during a later step (see FIG. 3).

The first $M_x$ metal 208 and the second $M_x$ metal 210 may be formed in the $M_x$ dielectric 202 in accordance with typical techniques. The first $M_x$ metal 208 may consist of a typical line or wire found in a typical semiconductor circuit and the second $M_x$ metal 210 may consist of a line or wire which will form the base structure for an e-fuse. The first $M_x$ metal 208 and the second $M_x$ metal 210 may be fabricated using, for example, a typical single damascene technique in which a conductive interconnect material may be deposited in a trench formed in the $M_x$ dielectric 202. In one embodiment, the first $M_x$ metal 208 and the second $M_x$ metal 210 may include various barrier liners (not shown). One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using an electroplating technique prior to filling the trench. The seed layer may also include similar dopants as the conductive interconnect material.

Figure 3:
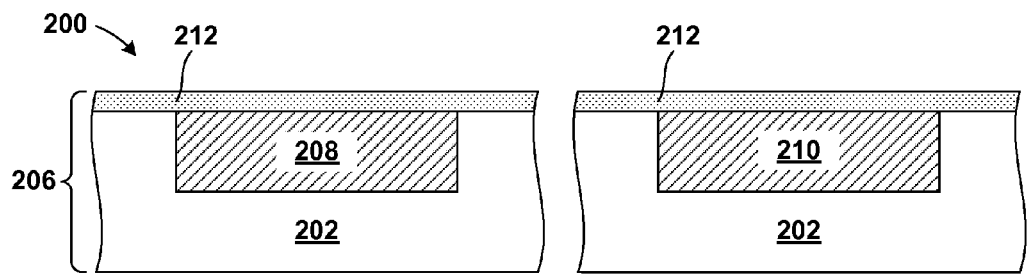

Referring now to FIG. 3, the $M_x$ cap dielectric 212 may be deposited over the structure 200. The $M_x$ cap dielectric 212 may electrically insulate the $M_x$ level 206 from additional interconnect levels (not shown) that may be subsequently formed above the $M_x$ level 206. The $M_x$ cap dielectric 212 may be deposited using typical deposition techniques, for example, chemical vapor deposition. The $M_x$ cap dielectric 212 may include, for example, $Si_3N_4$, silicon carbide (SiC), silicon carbon nitride (SiCN), silicon carbon hydrogen (SiCH), or other known capping materials. The $M_x$ cap dielectric 212 may have a thickness ranging from about 20 nm to about 30 nm and ranges there between, although a thickness less than 20 nm and greater than 30 nm may be acceptable.

Figure 4:
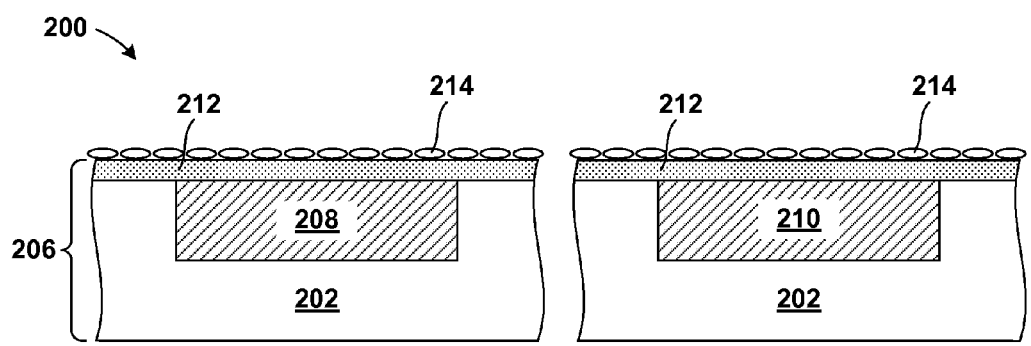

Referring now to FIG. 4, a plurality of nano-particles 214 may be deposited over the structure 200. The plurality of nano-particles 214 may be deposited by spraying a solution containing the nano-particles onto the surface of the structure 200. The liquid may then be evaporated leaving the plurality of nano-particles 214 remaining on a top surface of the $M_x$ cap dielectric 212. This technique may be referred and known as spin coating. The plurality of nano-particles 214 may include, for example, any suitable refractory metal nitride. In one embodiment, For example, the plurality of nano-particles 214 may include titanium nitride (TiN), tantalum nitride (TaN), tungsten nitride (WN), ruthenium nitride (RuN), or other known refractory metal nitrides. The plurality of nano-particles 214 may have a thickness ranging from about 1 nm to about 10 nm and ranges there between, although a thickness less than 1 nm and greater than 10 nm may be acceptable. The plurality nano-particles 214 may generally be round in shape and include a width ranging from about 1 nm to about 10 nm; however, nano-particles having any variety of shapes and sizes may be expressly contemplated herein.

Figure 5:
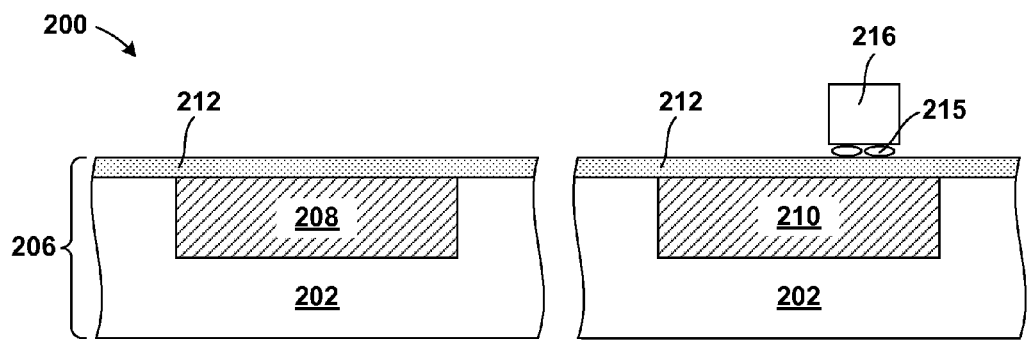

Referring now to FIG. 5, a block mask 216 may be applied above a portion of the second $M_x$ metal 210. The block mask 216 may be applied above only some of the plurality of nano-particles 214 (FIG. 4) related to the formation of an e-fuse. Thus, the area of the structure 200 protected by the block mask 216 may be referred to as the fuse area and the area of the structure 200 not protected by the block mask 216 may be referred to as the non-fuse area.

The block mask 216 can be a soft mask such as photoresist or a hardmask layer such as TEOS or silicon nitride. A negative or a positive photoresist technique may be used to achieve the requisite block mask 216. Meanwhile, some of the plurality of nano-particles 214 (FIG. 4) located above the non-fuse area of the structure 200 may be subsequently removed. The block mask 216 may be suitable for protecting some of the plurality of nano-particles 214 (FIG. 4) located in the fuse area from being removed. Any suitable etching technique may be used to remove some of the plurality of nano-particles 214 (FIG. 4) located in the non-fuse area of the structure 200. For example, a dry etching technique using plasma based etchant may be used to remove some of the plurality of nano-particles 214 (FIG. 4) located in the non-fuse area of the structure 200.

With continued reference to FIG. 5, after the removal of some of the plurality of nano-particles 214 (FIG. 4), the block mask 216 may be removed using any suitable etching technique known in the art. When the soft mask is used, it can be removed, for example, by ashing. When the hardmask mask is used, it can be removed, for example, by selective etching. Alternatively, it should be noted that a mask may be used to protect the non-fuse areas of the structure from the deposition of the nano-particles, and allow nano-particles to be deposited in the fuse area only. After the block mask 216 is removed at least one nano-particle 215 may remain.

Figure 6:
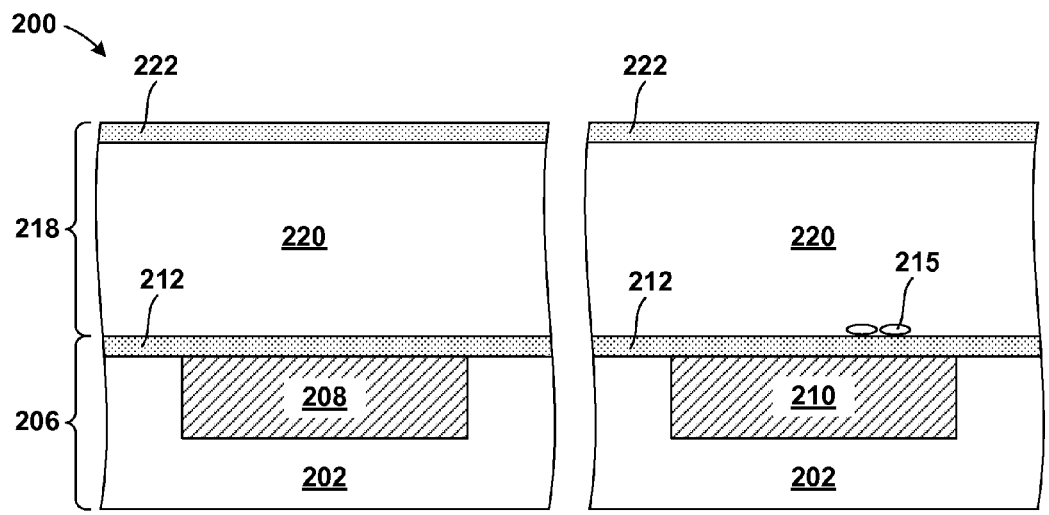

Referring now to FIG. 6, an $M_{x+1}$ level 218 located above the $M_x$ level 206 is shown. The $M_{x+1}$ level 218 may include an $M_{x+1}$ dielectric 220. Like the $M_x$ dielectric 202, the $M_{x+1}$ dielectric 220 may be, for example, $SiO_2$, $Si_3N_4$, SiCOH, SiLK, or porous dielectrics. It should be noted that while only two interconnect levels are shown, the structure 200 may have multiple interconnect levels above the $M_{x+1}$ level 218 and below the $M_x$ level 206. An $M_{x+1}$ cap dielectric 222 may be deposited over the structure 200 and above the $M_{x+1}$ level 218. The $M_{x+1}$ cap dielectric 222 may electrically insulate the $M_{x+1}$ level 218 from additional interconnect levels (not shown) that may be subsequently formed above the $M_{x+1}$ level 218. The $M_{x+1}$ cap dielectric 222 may be deposited by a similar technique and may include similar materials as the $M_x$ cap dielectric 212 described above. Also, The $M_{x+1}$ cap dielectric 222 may have a similar thickness as the $M_x$ cap dielectric 212 described above.

Figure 7:
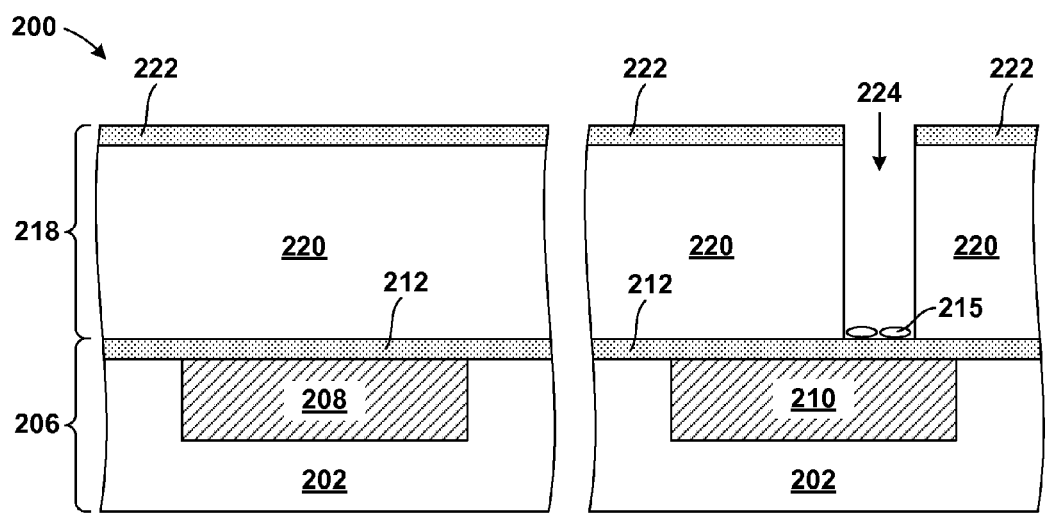

Referring now to FIG. 7, a via opening 224 may be etched into the $M_{x+1}$ level 218. The via opening 224 may be formed by any suitable etching technique known in the art. Preferably, the etching technique chosen to form the via opening 224 may remove only a portion of the $M_{x+1}$ level 218 and stop on the $M_x$ cap dielectric 212. In one embodiment, for example, a dry plasma based etching technique using a $C_xF_y$ based etchant may be used to form the via opening 224. Preferably, the at least one nano-particle 215 may be present at a bottom of the via opening 224.

Figure 8:
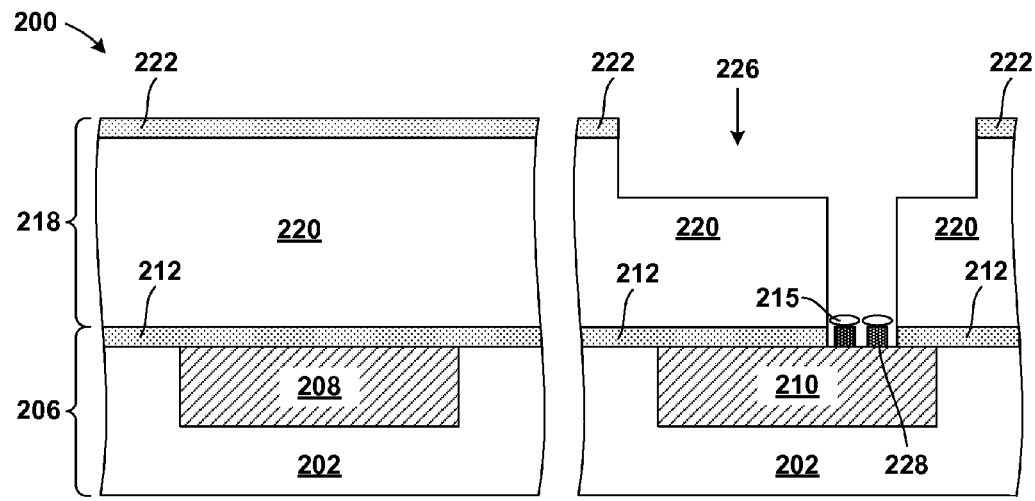

Referring now to FIG. 8, a trench opening 226 may be etched into the $M_{x+1}$ level 218 directly above the via opening 224. The trench opening 226 may be formed by any suitable etching technique known in the art. Preferably, the etching technique chosen to form the trench opening 226 may remove only a portion of the $M_{x+1}$ level 218 to a depth ranging from about 50 nm to about 150 nm. In one embodiment, for example, a dry oxygen plasma based etching technique using a $C_xF_y$ based etchant may be used to form the trench opening 226. Alternately, a carbon dioxide plasma based dry etching technique using a similar etchant may be used to form the trench opening 226.

The at least one nano-particle 215 may be resistant to the etching technique used to form the via opening 224 or the trench opening 226. However, the etching technique chosen to form the trench opening 226 may also remove a portion of the $M_x$ cap dielectric 212 resulting in the formation of one or more nano-pillars 228. The nano-pillar 228 may be formed from the $M_x$ cap dielectric 212, directly beneath the at least one nano-particle 215 remaining. As shown in the figure, the width of the nano-pillar 228 may be smaller than the width of the at least one nano-particle 215 due to typical undercut caused by the etching technique. Similarly, the nano-pillar 228 may have a vertical height no greater than the thickness of the $M_x$ cap dielectric 212. After the via opening 224 and the trench opening 226 are formed the structure may undergo a cleaning technique.

Figure 9:
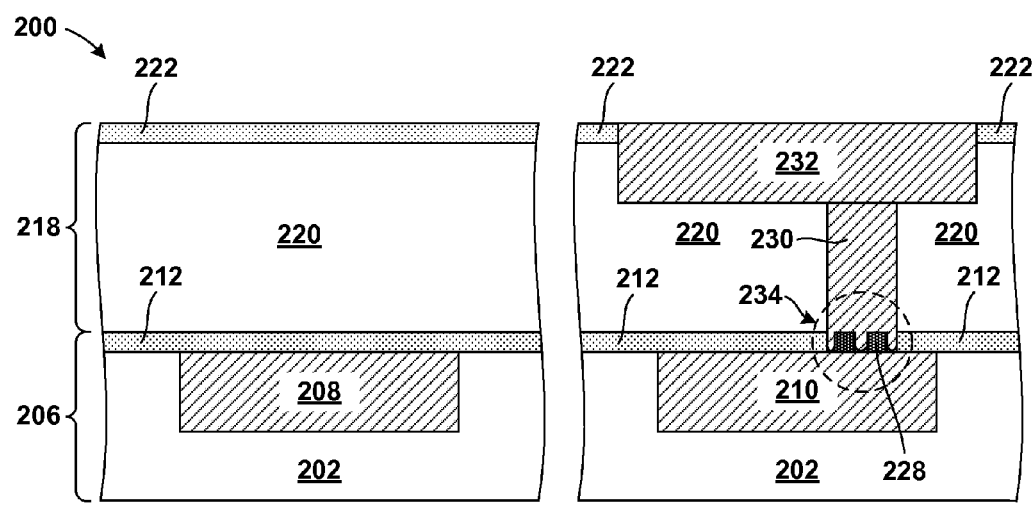

Referring now to FIG. 9, an optional cleaning technique may be used to remove the at least one nano-particle 215

(FIG. 8). The at least one nano-particle 215 (FIG. 8) remaining may be removed by any suitable removal technique known in the art. Preferably, the removal technique chosen to remove the at least one nano-particle 215 form atop the nano-pillar 228 may remove only the at least one nano-particle 215 and have little if any effect on the surrounding structure. In one embodiment, for example, a dry etching technique including plasma ashing may be used to remove the at least one nano-particle 215. Alternately, a wet etching technique using a chlorine based etchant may be used to remove the at least one nano-particle 215. Alternatively, the at least one nano-particle 215 may remain atop the nano-pillar 228.

Next, the via opening 224 and the trench opening 226 may be filled with a conductive interconnect material to form a via 230 and an $M_{x+1}$ metal 232. The via 230 and the $M_{x+1}$ metal 232 may be formed in the $M_{x+1}$ dielectric 220 in accordance with typical techniques. The $M_{x+1}$ metal 232 may consist of a typical line or wire found in a typical semiconductor circuit and may consist of a line or wire which will form the base structure for the e-fuse. The via 230 may typically be formed concurrent with the $M_{x+1}$ metal 232. The via 230 and the $M_{x+1}$ metal 232 may include various barrier liners as described above.

Vias, generally, may be used to form electrical connections between the metallization of two interconnect levels. The via 230 may provide an electrical connection between the second $M_x$ metal 210 and the $M_{x+1}$ metal 232. The via 230 may have an aspect ratio of about 4:1 or more, and a diameter or width ranging from about 10 nm to about 50 nm and ranges there between, although a via diameter less than 10 nm and greater than 50 nm may be acceptable.

Figure 9A:
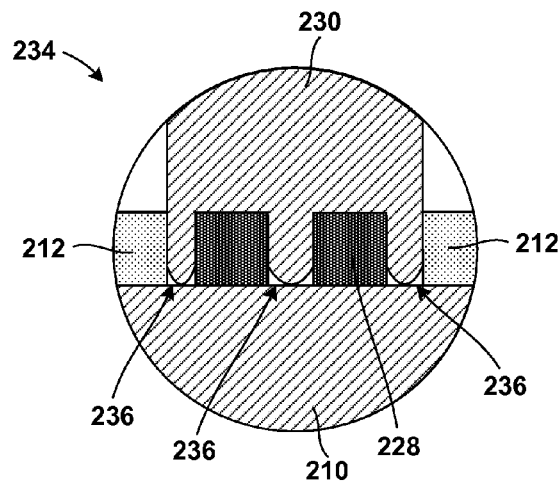
FIG. 9A depicts a section view of FIG. 9 according to an exemplary embodiment.

A section view 234 of FIG. 9 is depicted in FIG. 9A. The section view 234 illustrates an intersection between the second $M_x$ metal 210 and the via 230, including the nano-pillar 228. When the via 230 is filled with the conductive interconnect material the nano-pillar 228 may cause a small void 236 to form at the intersection between the second $M_x$ metal 210 and the via 230. Typically, any void formation in a via is undesirable; however, in the present embodiment, the formation of the small void 236 may be a desired result. The nano-pillar 228 provides a non-uniform geometry at the bottom of the via 230 making filling the via 230 with the conductive interconnect material difficult. Nano-pillars may provide the requisite geometry to induce the formation of small voids; however, any geometry or feature capable of producing similar small voids at the interface between the via 230 and the second $M_x$ metal 210 is expressly contemplated herein. It should be noted that the presence of the small void 236 may not affect electrical continuity between the second $M_x$ metal 210 and the $M_{x+1}$ metal 232. The small void 236 may typically form at right angle corners created by the nano-pillar 228. Alternatively, non-uniform geometry at the bottom of the via 230 may increase the compressive stress within the interconnect material. The local compressive stress facilitates the formation and growth of voids during programming, and thereby weakening the copper connection at the bottom of the via 230.

With continued reference to FIG. 9, the final e-fuse structure is shown. The left side of FIG. 9 represents a non-fuse structure, while the right side of FIG. 9 represents the e-fuse structure. The second $M_x$ metal 210, the via 230, and the $M_{x+1}$ metal 232 together form the final e-fuse structure. Assuming current flows from the second $M_x$ metal 210 to the $M_{x+1}$ metal 232, the addition of the small void 236 (FIG. 9A) may improve e-fuse programming by requiring lower programming voltages. Programming may be improved due to the existence of the small void 236 (FIG. 9A) at the bottom of the via 230. Alternatively, programming may be improved due to the increase in the compressive stress within the interconnect material at the bottom of the via 230. Therefore, the present embodiment may improve reliability and repeatability of the e-fuse structure.

Figure 10:
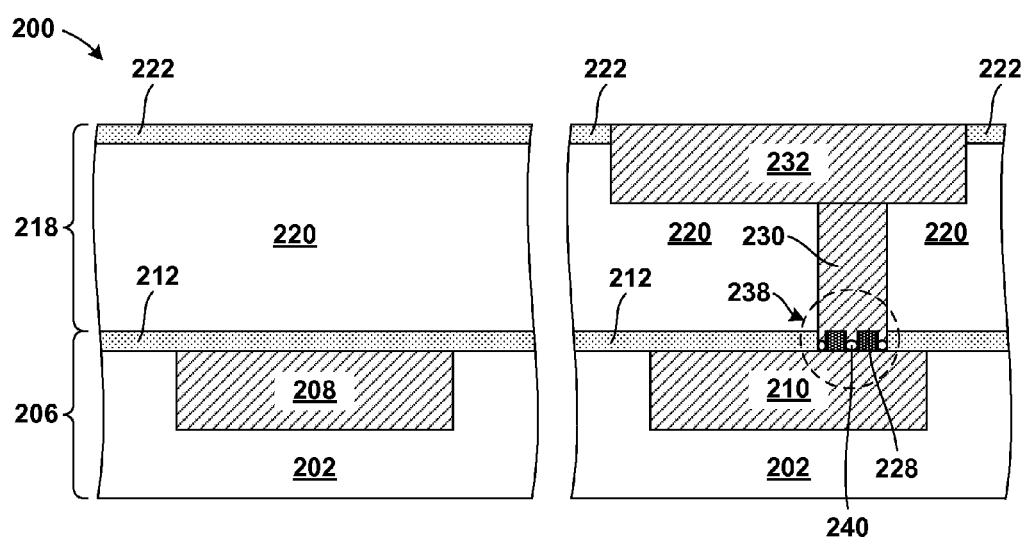
Figure 10A:
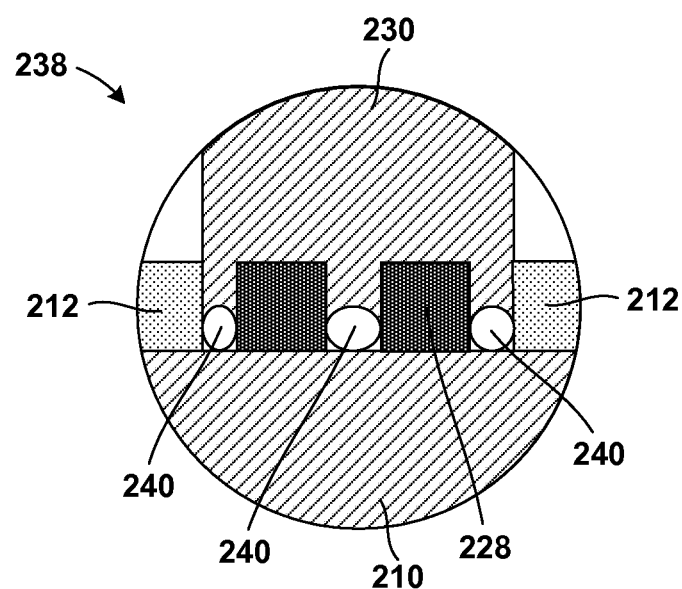
FIG. 10A depicts a section view of FIG. 10 according to an exemplary embodiment.

Now referring to FIG. 10, the final e-fuse structure is shown after programming. Programming the e-fuse may include applying a suitable current from the second $M_x$ metal 210 through the via 230 to the $M_{x+1}$ metal 232. Decreased EM resistance at the site of the small void 236 may allow them to propagate and grow larger into a large void 240. Alternatively, the increased compressive stress within the interconnect material, cause by the non-uniform geometry at the bottom of the via 230, may also encourage the formation of the large void 240. The large void 240 may create an open circuit between the second $M_x$ metal 210 and the $M_{x+1}$ metal 232. This configuration may provide more consistency and reliability during programming of the e-fuse because the large void 240, or open circuit, may be more likely located in the via 230 as opposed to the second $M_x$ metal 210 because of the weakened interface caused by the nano-pillar 228. Therefore, programming may not affect any other circuit other than the targeted e-fuse because the large void 240, or open circuit, may be consistently located at the bottom of the via 230. A section view 238 of FIG. 10 is depicted in FIG. 10A. The section view 238 illustrates the intersection between the second $M_x$ metal 210 and the via 230, including the nano-pillar 228 and the large void 240.

Another method by which to increase the programming reliability and repeatability of the e-fuse structure is described in detail below by referring to the accompanying drawings FIGS. 11-14. More specifically, a block copolymer nanotemplate may be used to form the nano-pillars at the intersection of the metallization metal and the via. Like above, it should be noted that while only two $M_x$ metals are depicted in the following set of drawings a single chip may include more than two $M_x$ metals.

Figure 11:
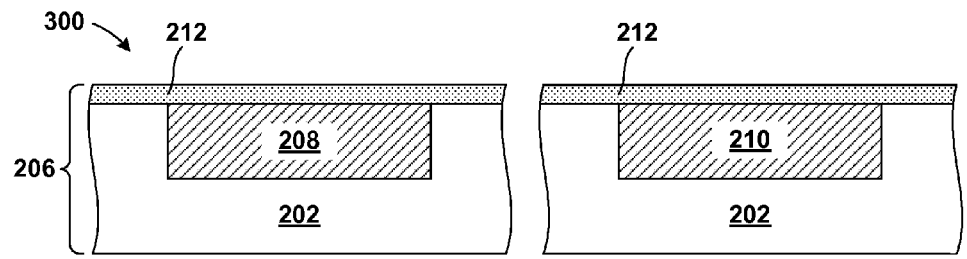
FIG. 11 depicts an $M_x$ level having a first $M_x$ metal and a second $M_x$ metal, and an $M_x$ cap dielectric according to an exemplary embodiment.

Referring now to FIG. 11, a structure 300 is shown. The structure 300 may include the $M_x$ level 206. The $M_x$ level 206 may include the $M_x$ dielectric 202, the first $M_x$ metal 208, the second $M_x$ metal 210, and the $M_x$ cap dielectric 212, as described above.

Figure 12:
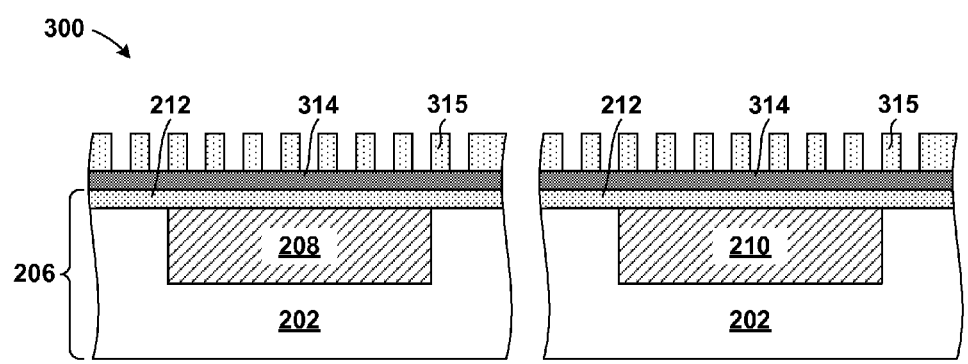
FIG. 12 depicts the formation of a block copolymer nanotemplate according to an exemplary embodiment.

Referring now to FIG. 12, an intermediate layer 314 followed by a block copolymer nanotemplate 315 may be formed on top of the structure 300, as shown. The intermediate layer 314 may be deposited using known deposition techniques, for example, atomic layer deposition, physical vapor deposition, or chemical vapor deposition. The intermediate layer 314 may include, for example, any suitable refractory metal nitride. In one embodiment, for example, the intermediate layer 314 may include TiN, TaN, WN, RuN, or other known refractory metal nitrides. The intermediate layer 314 may have a thickness ranging from about 1 nm to about 10 nm and ranges there between, although a thickness less than 1 nm and greater than 10 nm may be acceptable.

The intermediate layer 314 may be substantially similar to the plurality of nano-particles 214 described in detail above. The difference between the plurality of nano-particles 214 and the intermediate layer 314 may be the contact areas with which they each contact the cap dielectric 212. The contact area between the intermediate layer 314 and the $M_x$ cap dielectric 212, both of the structure 300, may be larger than the contact area between the plurality of nano-particles 214 and the $M_x$ cap dielectric 212, both of the structure 200. The limited contact area between the plurality of nano-particles 214 and the $M_x$ cap dielectric 212 of the structure 200 may result in the plurality of nano-particles 214 being displaced during subsequent processing operations. Whereas, the increased contact area between the intermediate layer 314 and the $M_x$ cap dielectric 212 of the structure 300 may decrease any risk of the intermediate layer 314 being displaced during subsequent processing operations.

The block copolymer nanotemplate 315 may be formed on top of the intermediate layer 314. In one embodiment, the block copolymer nanotemplate 315 may be deposited or formed on the intermediate layer 314 using spin-coating, dip-coating, or drop-coating. The block copolymer nanotemplate 315 may be a thin layer having features smaller than the minimal resolution features. In other words, the features of the block copolymer nanotemplate 315 may be smaller, in one implementation, than the minimum spacing between adjacent $M_x$ metals. The block copolymer nanotemplate 315 may be a material which self assemblies itself into substantially uniformly shaped and spaced holes or features. For example, the block copolymer nanotemplate 315 may be a self assembled monolayer templated porous or permeable film. The block copolymer nanotemplate 315 may be e-beam, UV, or thermally cured.

The spacing and width of the features of the block copolymer nanotemplate 315 may range from, for example, below 5 nm to 100 nm. In one embodiment, the features of the block copolymer nanotemplate 315 may be about 20 nm wide with a spacing of about 20 nm there between. The thickness of the block copolymer nanotemplate 315, in one embodiment, may be about 20 nm and may be made from an organic polymer matrix having a mesh of holes. It should be understood, though, that the thickness of the block copolymer nanotemplate 315 may vary depending on the required feature resolution and other factors, all of which can be ascertained by one of ordinary skill in the art in view of the description herein. In one embodiment, the block copolymer nanotemplate 315 may include a diblock copolymer resist having two polymeric chains, or blocks, which are chemically different and covalently attached to one another.

Figure 13:
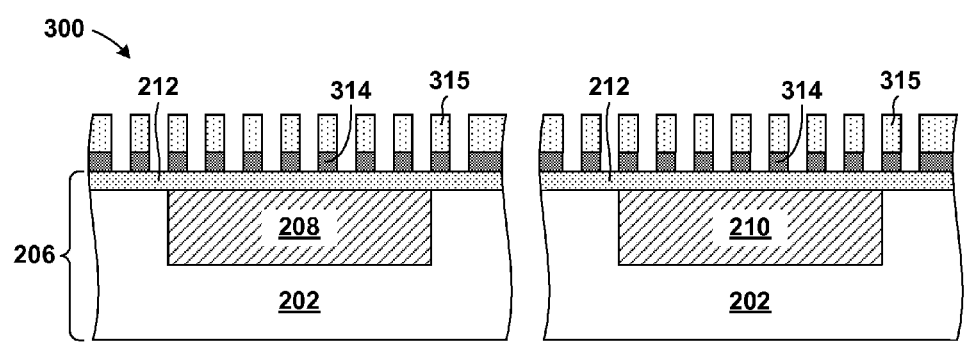
FIG. 13 depicts transferring the pattern of the block copolymer nanotemplate to an intermediate layer according to an exemplary embodiment.

Referring now to FIG. 13, any known suitable non-selective physical etch may be used to transfer the pattern of the block copolymer nanotemplate 315 to the intermediate layer 314. Fore example, in one embodiment, $CF_4$/Ar based plasma may be used to etch the pattern of the block copolymer nanotemplate 315 into the intermediate layer 314.

Figure 14:
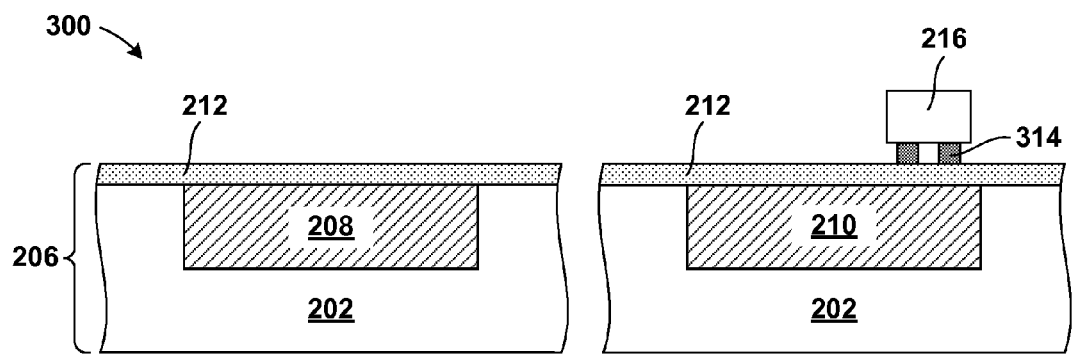
FIG. 14 depicts masking a fuse region and removing a portion of the intermediate layer according to an exemplary embodiment.

Referring now to FIG. 14, the block copolymer nanotemplate 315 may be removed and the block mask 216 may be applied above the intermediate layer 314 in the fuse area above the second $M_x$ metal 210. Any suitable removal technique known in the art may be used to remove the block copolymer nanotemplate 315. In one embodiment, the block copolymer nanotemplate 315 may be removed using a wet clean technique such as dilute hydrofluoric acid (DHF)

As described in detail above, the block mask 216 may be applied above only a portion of the intermediate layer 314 related to the formation of the e-fuse and the portion of the intermediate layer 314 not protected by the block mask may be removed. The block mask 216 may then be removed like above.

The fabrication steps and techniques detailed above with reference to FIGS. 6-10 may be used to complete the structure 300. It should be noted that like the structure 200, the structure 300 may have on or more nano-pillars 228 at the interface between the via 230 and the second $M_x$ metal 210, and the structure 300 may have similar programming characteristics as described above for the structure 200.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming an electronic fuse, the method comprising:
   providing an $M_x$ level comprising a first $M_x$ metal, a second $M_x$ metal, and an $M_x$ cap dielectric above of the first and second $M_x$ metal;
   forming an $M_{x+1}$ level above the $M_x$ level, the $M_{x+1}$ level comprising an $M_{x+1}$ metal and a via electrically connecting the second $M_x$ metal to the $M_{x+1}$ metal in a vertical orientation; and
   forming a nano-pillar from the $M_x$ cap dielectric at a bottom of the via and above the second $M_x$ metal, the nano-pillar having a height less than a height of the via.

2. The method of claim 1, wherein forming the nano-pillar further comprises:
   depositing a nano-particle using a spin-on technique, on top of the $M_x$ cap dielectric above the second $M_x$ metal; and
   etching the $M_x$ cap dielectric selective to the nano-particle to form the nano-pillar.

3. The method of claim 1, wherein forming the nano-pillar further comprises:
   depositing an intermediate layer on top of the $M_x$ cap dielectric above the second $M_x$ metal;
   forming a block copolymer nanotemplate on top of the intermediate layer;
   transferring a pattern of the block copolymer nanotemplate to the intermediate layer; and
   etching the $M_x$ cap dielectric to form the nano-pillar.

4. The method of claim 2, wherein depositing the nano-particle comprises depositing a refractory metal nitride.

5. The method of claim 2, wherein depositing the nano-particle comprises depositing TiN, TaN, WN, or RuN.

6. The method of claim 3, wherein depositing the intermediate layer comprises depositing a refractory metal nitride.

7. The method of claim 3, wherein depositing the intermediate layer comprises depositing TiN, TaN, WN, or RuN.

* * * * *